(12) United States Patent
Jiang et al.

(10) Patent No.: US 9,935,630 B2
(45) Date of Patent: Apr. 3, 2018

(54) AC SWITCH CIRCUIT AND ASSOCIATED CONTROL METHOD

(71) Applicant: Monolithic Power Systems, Inc., San Jose, CA (US)

(72) Inventors: Jian Jiang, Los Gatos, CA (US); Pengjie Lai, San Jose, CA (US); Bo Zhou, San Jose, CA (US); Junyong Gong, Chengdu (CN); Eric Yang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 194 days.

(21) Appl. No.: 14/859,102

(22) Filed: Sep. 18, 2015

(65) Prior Publication Data

US 2017/0084404 A1    Mar. 23, 2017

(51) Int. Cl.
*H01H 19/64*   (2006.01)
*H03K 17/689*   (2006.01)
*H03K 17/687*   (2006.01)

(52) U.S. Cl.
CPC ....... *H03K 17/689* (2013.01); *H03K 17/6874* (2013.01); *H03K 2217/0009* (2013.01); *H03K 2217/0081* (2013.01)

(58) Field of Classification Search
CPC ............. H03K 17/689; H03K 17/6874; H03K 2217/0009; H03K 2217/0081
See application file for complete search history.

(56) References Cited

U.S. PATENT DOCUMENTS

| | | | | |
|---|---|---|---|---|
| 4,649,302 A * | 3/1987 | Damiano | ........... | H03K 17/6874 323/351 |
| 4,672,246 A * | 6/1987 | Donovan | ............. | H03K 17/687 327/436 |
| 4,808,859 A * | 2/1989 | Even-or | ............... | H03K 17/162 327/382 |
| 5,006,737 A * | 4/1991 | Fay | .................... | H03K 17/6874 327/434 |
| 5,629,607 A * | 5/1997 | Callahan | ................. | H02M 1/44 323/237 |
| 6,172,552 B1 * | 1/2001 | Tamai | ................ | H03K 17/6874 327/427 |
| 7,196,435 B2 * | 3/2007 | Kugelman | ........... | H03K 17/133 307/141.8 |
| 8,446,050 B2 | 5/2013 | Klapatch | | |
| 8,643,351 B2 | 2/2014 | Lai et al. | | |
| 8,693,276 B2 | 4/2014 | Lai et al. | | |

(Continued)

*Primary Examiner* — Daniel Cavallari
(74) *Attorney, Agent, or Firm* — Perkins Coie LLP (57) ABSTRACT

An AC switch circuit coupled between an AC input signal and an AC load has a first switch, a second switch, a driving circuit, and a power generation circuit. The first switch blocks a first half-cycle of the AC input signal when turned OFF, and the second switch blocks a second half-cycle of the AC input signal when turned OFF. The driving circuit provides a driving signal to control the first switch and the second switch based on an enable signal. The power generation circuit provides a voltage signal to power the driving circuit. The power generation circuit stores energy from the AC input signal when the first switch and the second switch are turned OFF, and the power generation circuit is disconnected from the AC input signal when the first switch and the second switch are turned ON.

10 Claims, 9 Drawing Sheets

(56) References Cited

U.S. PATENT DOCUMENTS

| | | | |
|---|---|---|---|
| 8,933,533 B2* | 1/2015 | Mauder | H03K 17/687 257/328 |
| 2004/0227560 A1* | 11/2004 | de Buda | H03K 17/6874 327/427 |
| 2013/0154391 A1* | 6/2013 | Urciuoli | H03K 17/081 307/112 |
| 2016/0173980 A1* | 6/2016 | Cecchin | H04R 3/00 381/123 |

* cited by examiner

FIG. 11 ure T1 to receive a first AC voltage, e.g., 110V/AC. A HVAC load 12
AC SWITCH CIRCUIT AND ASSOCIATED CONTROL METHOD

TECHNICAL FIELD

The present invention relates to electrical circuit, more particularly but not exclusively relates to AC switch.

BACKGROUND

Figure 1:
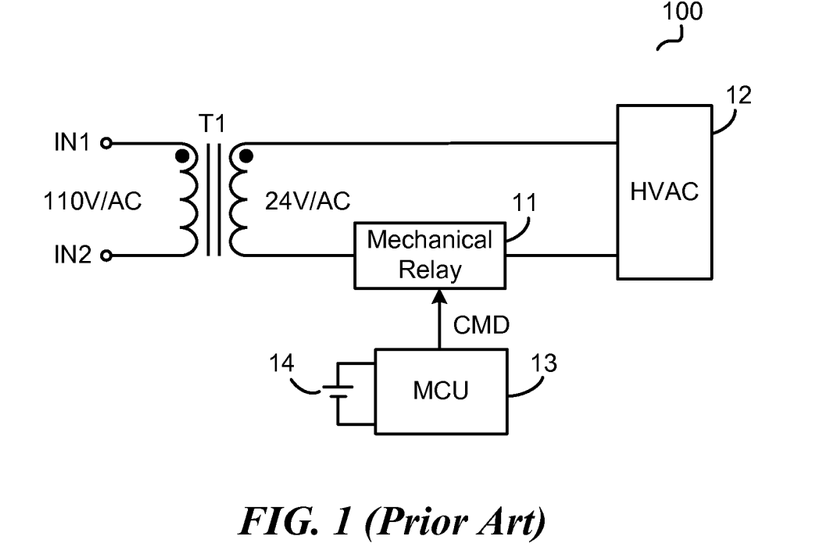
FIG. 1 illustrates a traditional HVAC control system 100 with a mechanical relay.

Traditionally, alternating current (AC) voltage supply is controlled through mechanical relay in home automation systems application, such as applications for sprinkler valve, heating ventilating and air conditioning (HVAC), thermostat, or security camera. FIG. 1 shows a traditional HVAC control system 100 with a mechanical relay. Traditional HVAC control system 100 is coupled to an electrical grid through a transformer T1. Transformer T1 comprises a primary winding and a secondary winding. The primary winding of transformer T1 is coupled to the electrical grid to receive a first AC voltage, e.g., 110V/AC. A HVAC load 12 is coupled to the secondary winding of transformer T1 to receive a second AC voltage, e.g., 24V/AC, through a mechanical relay 11. A Micro-Controller Unit (MCU) 13 provides a command signal CMD to mechanical relay 11 to control ON/OFF of mechanical relay 11. A battery 14 is used to power MCU 13.

However, with improvement of smart home automation technology, mechanical relay is bulky and has a short and not constant operating life.

SUMMARY

It is one of the objects of the present invention to provide an AC switch circuit and associated control method to solve the above problems.

One embodiment of the present invention discloses an AC switch circuit coupled between an AC input signal and an AC load, the AC switch circuit comprising: a first terminal, coupled to the AC input signal; a second terminal, coupled to the AC load; a first switch, coupled to block a first half-cycle of the AC input signal when turned OFF, wherein the first switch comprises a first terminal coupled to the first terminal of the AC switch circuit, a second terminal, and a control terminal; a second switch, coupled in series with the first switch to block a second half-cycle of the AC input signal when turned OFF, wherein the second switch comprises a first terminal coupled to the second terminal of the first switch, a second terminal coupled to the second terminal of the AC switch circuit, and a control terminal; a communication module, having an input terminal and a first output terminal, wherein the input terminal is configured to receive a command signal, and the first output terminal is configured to provide an enable signal based on the command signal, wherein the enable signal is isolated with the command signal; a driving circuit, having an input terminal, an output terminal, a power supply terminal and a ground reference terminal, wherein the power supply terminal is configured to receive a voltage signal, the ground reference terminal is coupled to the second terminal of the first switch and the first terminal of the second switch, the input terminal is configured to receive the enable signal, and the output terminal is coupled to the control terminal of the first switch and the control terminal of the second switch to provide a driving signal based on the enable signal and the voltage signal, wherein when the enable signal is at a first state, the driving signal is configured to turn ON and turn OFF the first switch and the second switch based on the voltage signal, and when the enable signal is at a second state, the driving signal is configured to turn OFF the first switch and the second switch; and a power generation circuit, having a first input terminal, a second input terminal, a first output terminal and a second output terminal, wherein the first input terminal is coupled to the first terminal of the AC switch circuit, the second input terminal is coupled to the second terminal of the AC switch circuit, the first output terminal is coupled to the power supply terminal of the driving circuit, and the second output terminal is coupled to the ground reference terminal of the driving circuit, and wherein the power generation circuit is charged by the AC input signal to store energy when the first switch and the second switch are turned OFF, and the power generation circuit is disconnected from the AC input signal when the first switch and the second switch are turned ON.

Another embodiment of the present invention discloses an AC switch circuit coupled between an AC input signal and an AC load, the AC switch circuit comprising: a first terminal, coupled to the AC input signal; a second terminal, coupled to the AC load; a first switch, coupled to block a first half-cycle of the AC input signal when turned OFF; a second switch, coupled in series with the first switch to block a second half-cycle of the AC input signal when turned OFF; a driving circuit, configured to provide a driving signal to control the first switch and the second switch based on an enable signal, wherein the driving circuit further comprises a power supply terminal, and a ground reference terminal coupled to a common node of the first switch and the second switch; and a power generation circuit, configured to provide a voltage signal across the power supply terminal of the driving circuit and the ground reference terminal of the driving circuit, wherein the power generation circuit is configured to store energy from the AC input signal when the first switch and the second switch are turned OFF.

Yet another embodiment of the present invention discloses a control method for an AC switch circuit coupled between an AC input signal and an AC load, wherein the AC switch circuit comprises a first switch and a second switch coupled in series, the control method comprising: blocking a first half-cycle of the AC input signal by the first switch when the first switch is turned OFF; blocking a second half-cycle of the AC input signal by the second switch when the second switch is turned OFF; rectifying the AC input signal to a DC signal, and charging a first capacitor by the DC signal to store energy when the first switch and the second switch are turned OFF; disconnecting the first capacitor from the AC input signal when the first switch and second switch are turned ON; providing a driving signal by a driving circuit to control the first switch and the second switch based on an enable signal and a voltage across the first capacitor; and powering the driving circuit by the voltage across the first capacitor.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Figure 2:
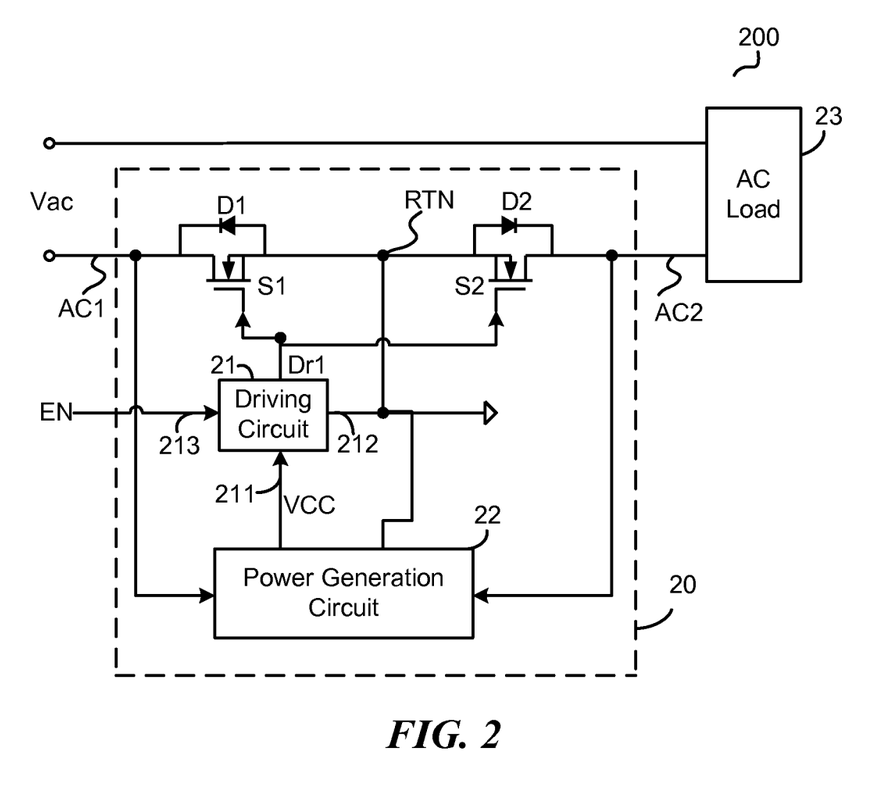
FIG. 2 schematically illustrates a circuit block diagram of an AC switch control system 200 according to an embodiment of the present invention.

FIG. 2 schematically illustrates a circuit block diagram of an AC switch control system 200 according to an embodiment of the present invention. AC switch control system 200 has two input ports to receive an AC input signal Vac. AC switch control system 200 comprises an AC load 23, and an AC switch circuit 20 coupled between AC input signal Vac and AC load 23, wherein AC input signal Vac is configured to power AC load 23 through AC switch circuit 20.

AC switch circuit 20 comprises a first terminal AC1, a second terminal AC2, a switch S1, a switch S2, a driving circuit 21 and a power generation circuit 22. First terminal AC1 of AC switch circuit 20 is coupled to one input port of AC switch control system 200 to receive AC input signal Vac, and second terminal AC2 of AC switch circuit 20 is coupled to one input terminal of AC load 23. The other input terminal of AC load 23 is coupled to the other input port of AC switch control system 200. When turned OFF, switch S1 is configured to block a first half-cycle of AC input signal Vac, e.g., a negative half-cycle. Switch S2 is coupled in series with switch S1, and when turned OFF, switch S2 is configured to block a second half-cycle of AC input signal Vac, e.g., a positive half-cycle. In one embodiment, switch S1 has a first terminal, a second terminal and a control terminal, the first terminal of switch S1 is coupled to first terminal AC1 of AC switch circuit 20, the second terminal of switch S1 is coupled to a neutral node RTN, and the control terminal of switch S1 is configured to receive a driving signal Dr1. Switch S1 further comprises a diode D1, the diode D1 has an anode coupled to neutral node RTN, and a cathode coupled to first terminal AC1 of AC switch circuit 20. In one embodiment, switch S2 has a first terminal, a second terminal and a control terminal, the first terminal of switch S2 is coupled to the second terminal of switch S1 at neutral node RTN, the second terminal of switch S2 is coupled to second terminal AC2 of AC switch circuit 20, and the control terminal of switch S2 is configured to receive driving signal Dr1. Switch S2 further comprises a diode D2, the diode D2 has an anode coupled to neutral node RTN, and a cathode coupled to second terminal AC2 of AC switch circuit 20. In the embodiment shown in FIG. 2 as one example, switch S1 is a Metal Oxide Semiconductor Field Effect Transistor (MOSFET) having a drain coupled to first terminal AC1 of AC switch circuit 20, a source coupled to neutral node RTN, and a gate configured to receive driving signal Dr1, switch S2 is a Metal Oxide Semiconductor Field Effect Transistor (MOSFET) having a drain coupled to second terminal AC2 of AC switch circuit 20, a source coupled to the source of switch S1 at neutral node RTN, and a gate configured to receive driving signal Dr1.

Driving circuit 21 comprises an input terminal 213 configured to receive an enable signal EN, a power supply terminal 211 configured to receive a voltage signal VCC, a ground reference terminal 212 coupled to neutral node RTN, and an output terminal configured to provide driving signal Dr1 to control switch S1 and switch S2 based on enable signal EN and voltage signal VCC. In one embodiment, switch S1 and switch S2 are integrated on a die, and grounding at neutral node RTN guarantees that a substrate voltage of the die to be always lowest during line cycle of AC input signal Vac. In one embodiment, when enable signal EN is at a first state, e.g., logic high, driving circuit 21 is configured to turn ON and turn OFF switch S1 and switch S2 based on voltage signal VCC, and when enable signal is at a second state, e.g., logic low, driving circuit 21 is configured to turn OFF switch S1 and switch S2.

Power generation circuit 22 comprises a first input terminal coupled to first terminal AC1 of AC switch circuit 20, a second input terminal coupled to second terminal AC2 of AC switch circuit 20, a first output terminal coupled to power supply terminal 211 of driving circuit 21 to provide voltage signal VCC, and a second output terminal coupled to ground reference terminal 212 of driving circuit 21. In one embodiment, power generation circuit 22 is configured to store energy from AC input signal Vac when switches S1 and S2 are turned OFF. And in one embodiment, power generation circuit 22 is disconnected from AC input signal Vac when switches S1 and S2 are turned ON.

Figure 3:
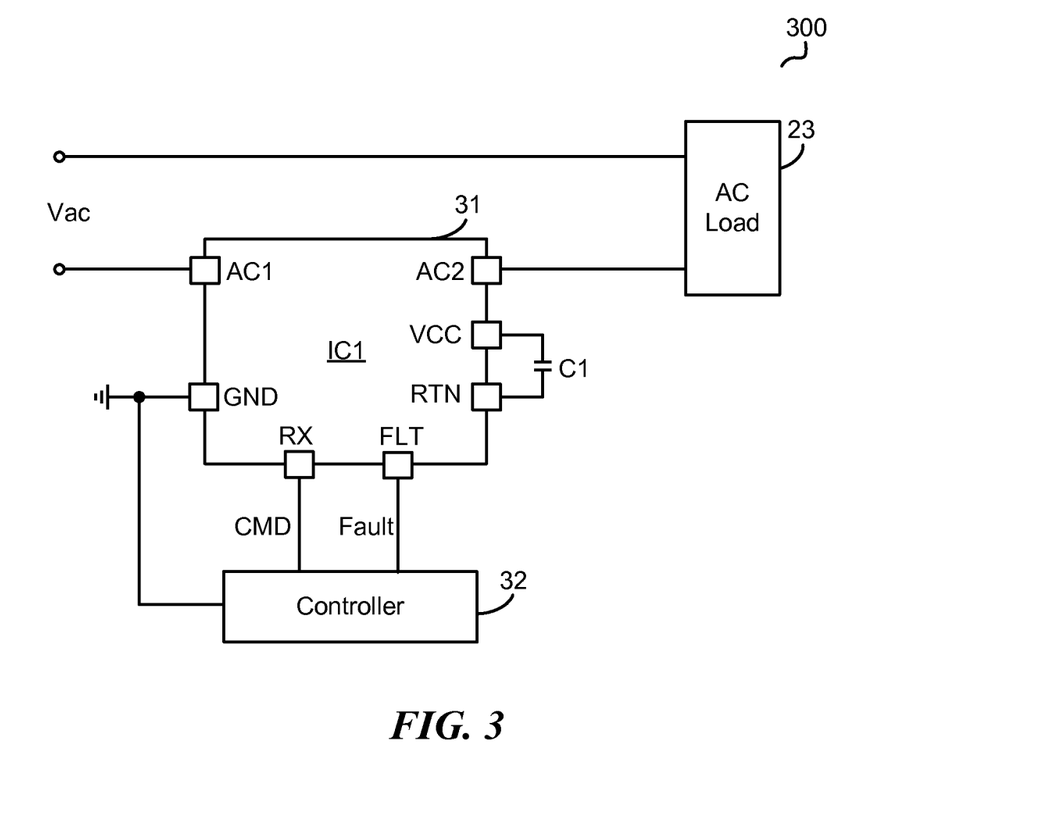
FIG. 3 schematically illustrates an AC switch control system 300 according to an embodiment of the present invention.

FIG. 3 schematically illustrates an AC switch control system 300 according to an embodiment of the present invention. AC switch control system 300 comprises two input ports to receive AC input signal Vac, AC load 23, and an AC switch circuit 31 coupled between AC input signal Vac and AC load 23, wherein AC input signal Vac is configured to power AC load 23 through AC switch circuit 31. In one embodiment, AC switch circuit 31 is integrated on a chip 101. Chip IC1 comprises Pins AC1, AC2, VCC, RTN, GND, FLT and RX. Symbols "AC1", "AC2" may represent Pins of chip IC1 or input terminals of AC switch circuit 31, symbol "VCC" may represent one Pin of chip IC1 or voltage signal VCC, symbol "RTN" may represent one Pin of chip IC1 or neutral node RTN, and symbol "GND" may represent one Pin of chip IC1 or a reference ground GND. Pin AC1 is coupled to one input port of AC switch control system 300 to receive AC input signal Vac, and Pin AC2 is coupled to one input terminal of AC load 23, the other input port of AC switch control system 300 is coupled to the other input terminal of AC load 23. A capacitor C1 is coupled between Pin VCC and Pin RTN. A controller 32 is employed to control ON/OFF of AC switch circuit 31 by sending a command signal CMD. Controller 32 has a ground reference terminal coupled to reference ground GND, an output terminal coupled to Pin RX of chip IC1 to provide command signal CMD, and an input terminal coupled to Pin FLT to receive a fault indicating signal Fault. In one embodiment, controller 32 may be a MCU (Microcontroller Unit), a Microprocessor, an ASIC (Application Specific Integrated Circuit), a PFGA (Field Programmable Gate Array), and so on.

Figure 4:
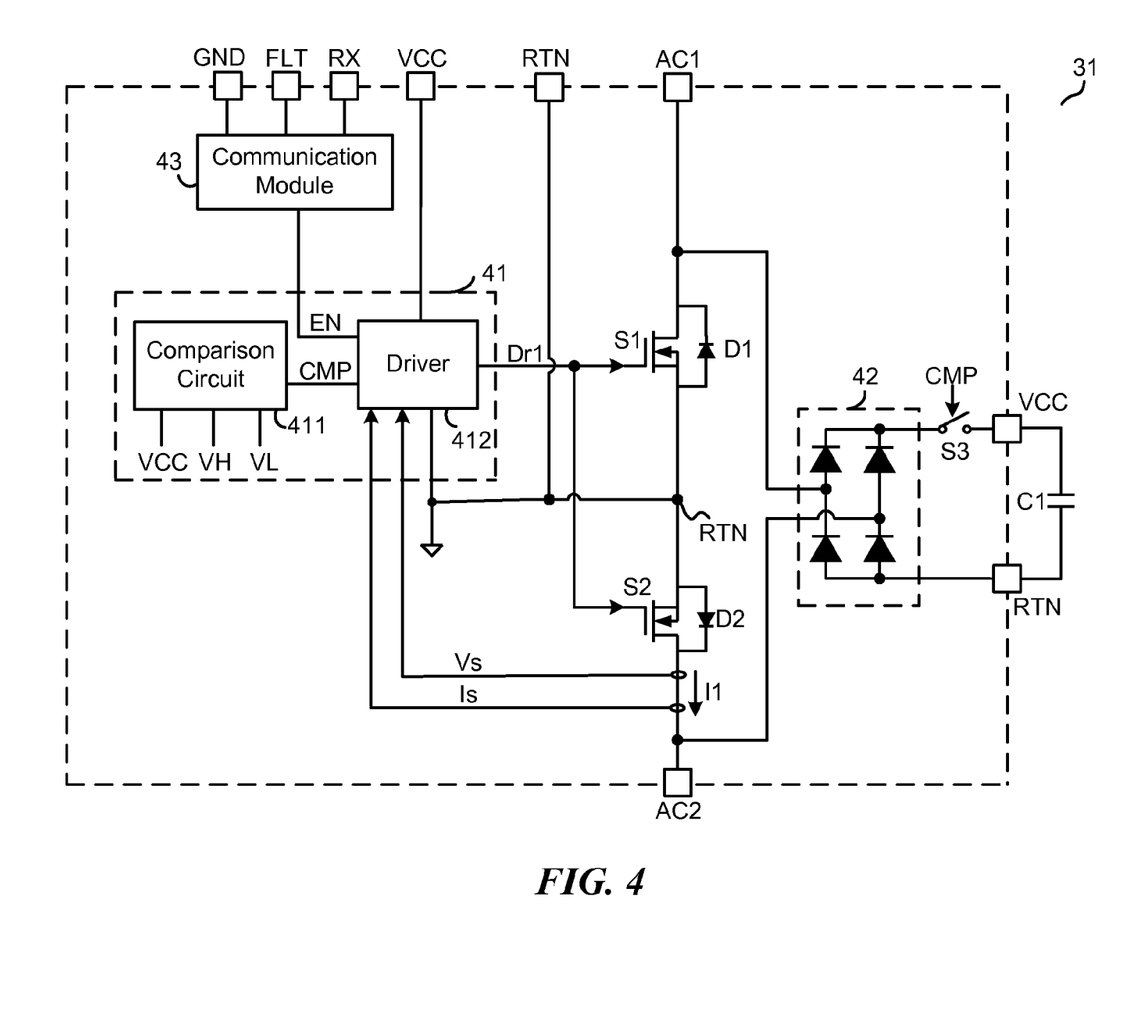
FIG. 4 schematically illustrates an AC switch circuit 31 according to an embodiment of the present invention.

FIG. 4 schematically illustrates AC switch circuit 31 according to an embodiment of the present invention. AC switch circuit 31 comprises a communication module 43, switch S1, switch S2, a driving circuit 41, and a power generation circuit comprising a rectifier circuit 42, a switch S3 and capacitor C1. One terminal of switch S1 is coupled to Pin AC1, the other terminal of switch S1 is coupled to one terminal of switch S2 at neutral node RTN, and the other terminal of switch S2 is coupled to Pin AC2. Neutral node RTN is coupled to pin RTN.

Driving circuit 41 is configured to provide driving signal Dr1 to control switch S1 and switch S2 based on enable signal EN and voltage signal VCC. In one embodiment, neutral node RTN is configured as a reference ground for driving circuit 41. In the embodiment shown in FIG. 4, driving circuit 41 comprises a comparison circuit 411 and a driver 412. Comparison circuit 411 is configured to receive voltage signal VCC, a high threshold VH, a low threshold VL, and is configured to provide comparison signal CMP based on voltage signal VCC, high threshold VH and low threshold VL. Driver 412 has a power supply terminal coupled to Pin VCC to receive voltage signal VCC, a ground reference terminal coupled to neutral node RTN, a first input terminal configured to receive enable signal EN, and a second input terminal coupled to comparison circuit 411 to receive comparison signal CMP. When enable signal EN is at the first state, e.g., logic high, driver 412 is configured to turn ON and turn OFF switch S1 and switch S2 based on comparison signal CMP, and when enable signal EN is at the second state, e.g., logic low, driver 412 is configured to turn OFF switch S1 and switch S2. In one embodiment, when enable signal EN is at the first state, if voltage signal VCC is less than low threshold VL, then driver 412 is configured to turn OFF switch S1 and switch S2; and if voltage signal VCC is larger than high threshold VH, then driver 412 is configured to turn ON switch S1 and switch S2. High threshold VH is larger than low threshold VL, e.g., high threshold VH is 9V, and low threshold VL is 6.5V.

In one embodiment, driving circuit 41 is further configured to receive a current sense signal Is indicative of a current I1 flowing through switch S1 and switch S2. Driver 412 is allowed to turn OFF switch S1 and switch S2 based on enable signal EN and comparison signal CMP when current I1 is close to zero. For example, driver 412 is configured to turn OFF switch S1 and switch S2 when voltage signal VCC is less than low threshold VL and current sense signal Is is less than a zero current threshold Ith. Or driver 412 is configured to turn OFF switch S1 and switch S2 when enable signal EN is at the second state and current sense signal Is is less than a zero current threshold Ith.

In one embodiment, driving circuit 41 is further configured to receive a voltage sense signal Vs indicative of a voltage across switch S1 or switch S2. Driver 412 is allowed to turn ON switch S1 and switch S2 based on enable signal EN when the voltage across switch S1 or switch S2 is close to zero. For example, driver 412 is configured to turn ON switch S1 and switch S2 when enable signal EN is at the first state and voltage sense signal Vs is less than a zero voltage threshold Vth.

Rectifier circuit 42 has a first input terminal coupled to Pin AC1, a second input terminal coupled to Pin AC2, a first output terminal coupled to Pin VCC and a second output terminal coupled to Pin RTN. In one embodiment, rectifier circuit 42 comprises four diodes configured as shown in FIG. 4. When switch S1 and switch S2 are turned OFF, rectifier circuit 42 is configured to rectify AC input signal Vac and provide a rectified DC (direct current) signal across the first output terminal and the second output terminal of rectifier circuit 42. Switch S3 is coupled between rectifier circuit 42 and capacitor C1. In the embodiment shown in FIG. 4, switch S3 is coupled between Pin VCC and rectifier circuit 42, however, switch S3 may be coupled between Pin RTN and rectifier circuit 42. In another embodiment, switch S3 may be omitted. Switch S3 has a control terminal configured to receive comparison signal CMP. When voltage signal VCC is less than low threshold VL, switch S1 and switch S2 are turned OFF, switch S3 is turned ON, and capacitor C1 is charged by AC input signal Vac though rectifier circuit 42 to store energy, then voltage signal VCC increases. And when voltage signal VCC is larger than high threshold VH, switch S1 and switch S2 are turned ON, switch S3 is turned OFF and capacitor C1 is disconnected from AC input signal Vac.

Figure 5:
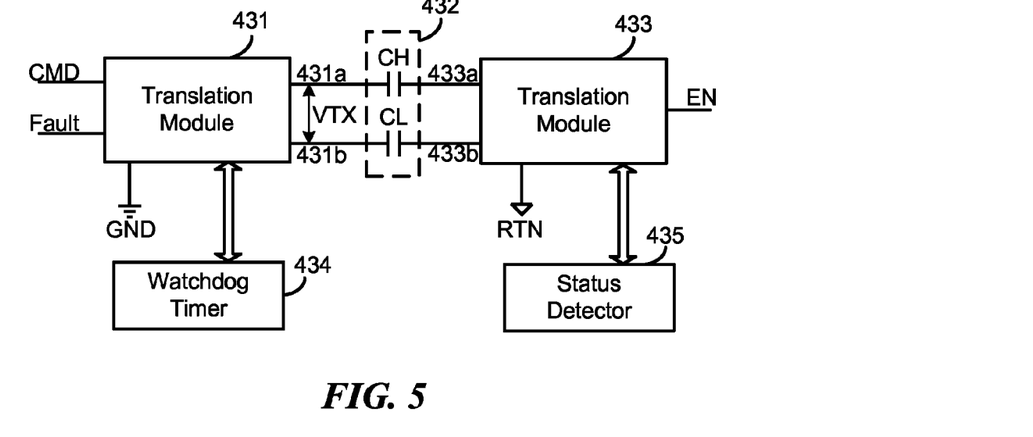
FIG. 5 schematically illustrates a communication module 43 according to an embodiment of the present invention.

Communication module 43 has an input terminal coupled to Pin RX to receive command signal CMD, a first output terminal configured to provide enable signal EN based on command signal CMD, a second output terminal coupled to Pin FLT to provide fault indicating signal Fault, and a ground reference terminal coupled to pin GND. In one embodiment, when command signal CMD is logic high, AC switch circuit 31 is configured to turn ON switch S1 and switch S2; and when command signal CMD is logic low, AC switch circuit 31 is configured to turn OFF switch S1 and switch S2. Fault indicating signal Fault is configured to indicate if there is any fault condition happens on AC switch circuit 31. In one embodiment, when fault happens on AC switch circuit 31, then fault indicating signal Fault becomes logic low, otherwise fault indicating signal Fault is logic high. FIG. 5 shows one embodiment of detailed circuit structure of communication module 43.

As shown in FIGS. 3-4, capacitor C1 can be used to power driving circuit 41 instead of using a battery, which saves cost of the system and labor maintenance. When switch S1 and switch S2 are turned OFF, AC input signal Vac is applied across terminal AC1 and terminal AC2 of AC switch circuit 31, and energy can be stored directly to capacitor C1 through rectifier 42. And when switch S1 and switch S2 are turned ON, capacitor C1 is disconnected from AC input signal Vac.

FIG. 5 schematically illustrates communication module 43 according to an embodiment of the present invention. Communication module 43 comprises a translation module 431, an isolation module 432, and a translation module 433. Translation module 431 comprises an input terminal configured to receive command signal CMD, an output terminal configured to provide fault indicating signal Fault, a data terminal 431a and a data terminal 431b, translation module 431 is configured to provide a differential signal VTX across data terminal 431a and data terminal 431b. Isolation module 432 is coupled between translation module 431 and translation module 433, and translation module 431 is isolated with driving circuit 41, the power generation circuit, switch S1 and switch S2. In one embodiment, isolation module 432 comprises isolated capacitors CH and CL. One terminal of isolated capacitor CH is coupled to data terminal 431a of translation module 431, and the other terminal of isolated capacitor CH is coupled to a data terminal 433a of translation module 433. One terminal of isolated capacitor CL is coupled to data terminal 431b of translation module 431, and the other terminal of isolated capacitor CL is coupled to a data terminal 433b of translation module 433. Translation module 433 further comprises an output terminal configured to provide enable signal EN based on differential signal VTX. A status detector 435 is configured to monitor AC switch circuit 31 and send status information of AC switch circuit 31 to translation module 433. Status information of AC switch circuit 81 may comprises SW abnormal, over current, over temperature, and so on. In one embodiment, when any fault condition happened on AC switch circuit 31 is detected by status detector 435, translation module 433 is configured to inform translation module 431 through isolation module 432, and translation module 431 is configured to inform controller 32 that fault has happened on AC switch circuit 31 by sending fault indicating signal Fault, e.g., with logic low.

In one embodiment, when receives command signal CMD, translation module 431 is configured to translate command signal CMD and send differential signal VTX with high frequency carrier signals. Translation module 433 is configured to translate differential signal VTX and send enable signal EN to driving circuit 41. After that translation module 433 may send back status information of AC switch circuit 31 to translation module 431 through isolation module 432, and translation module 431 is configured to provide fault indicating signal Fault correspondingly. Differential signal VTX may consist of groups of pulses, wherein each group of pulses contains high frequency carrier signals, for example 4 MHz carrier signals. In one embodiment, different number N of groups of pulses of differential signal VTX represents different commands. Table 1 shows one example of commands definition. When there are 2 groups of pulses within predetermined time period Tsend, i.e., N=2, differential signal VTX represents command "OFF". When there are 4 groups of pulses within predetermined time period Tsend, i.e., N=4, differential signal VTX represents command "ON".

TABLE 1 commands definition

| N | Command | Description |
|---|---------|-------------|
| 2 | OFF | Turn OFF AC switch circuit 71 |
| 4 | ON | Turn ON AC switch circuit 71 |

Translation module 433 is configured to provide enable signal EN based on differential signal VTX. If pulse number N of differential signal VTX represents command "ON", enable signal EN becomes logic high, and driving circuit 41 is configured to turn ON switch S1 and switch S2 based on voltage signal VCC. If pulse number N of differential signal VTX represents command "OFF", enable signal EN becomes logic low, and driving circuit 41 is configured to turn OFF switch S1 and switch S2.

In one embodiment, communication module 43 further comprises a watchdog timer 434. Watchdog timer 434 is configured to monitor status of command signal CMD every monitoring time period, e.g., 1 s. If command signal CMD is logic high, translation module 431 sends an ON command to turn ON switches S1 and S2. After that translation module 431 enters sleep mode to reduce a quiescent current. If command signal CMD is logic low, translation module 431 is enabled and sends an OFF command to turn OFF switches S1 and S2. At a rising edge or a falling edge of command signal CMD, watchdog timer 434 is waked up immediately to check status of command signal CMD and watchdog timer 434 is refreshed.

Figure 6:
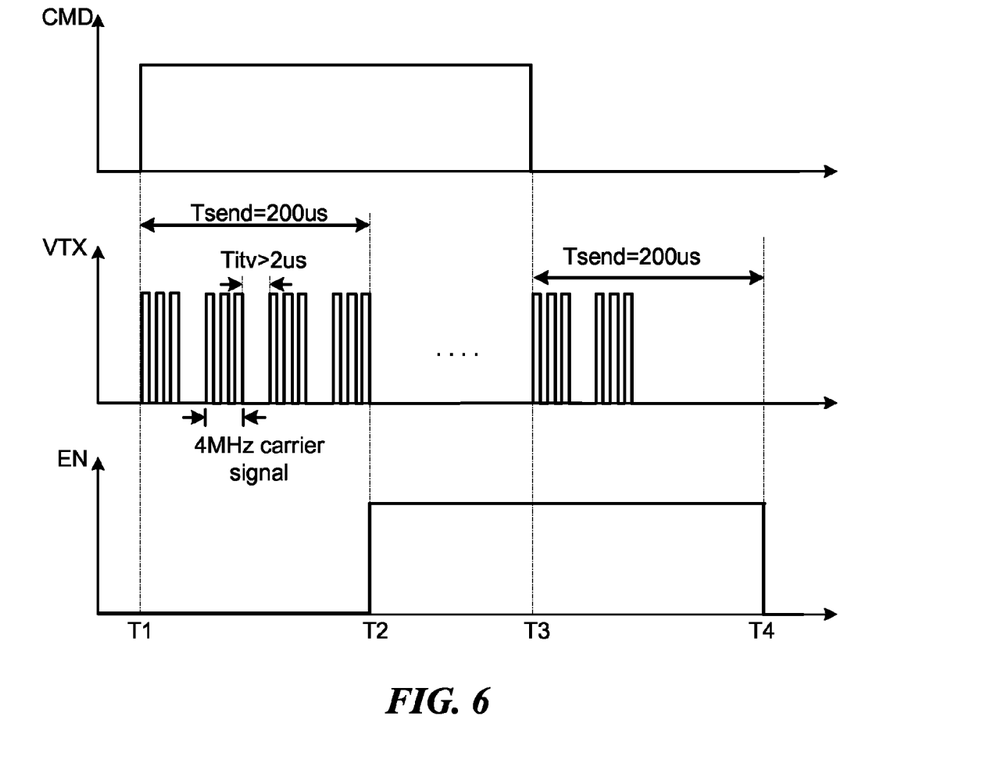
FIG. 6 shows waveforms of communication module 43 according to an embodiment of the present invention.

FIG. 6 shows waveforms of communication module 43 according to an embodiment of the present invention. As shown in FIG. 6, at time T1, command signal CMD becomes logic high, watchdog timer 434 is refreshed and translation module 431 is configured to provide differential signal VTX having 4 groups of pulses within predetermined time period Tsend which represents command "ON". In the embodiment shown in FIG. 6, predetermined time period Tsend is 200 us. In one embodiment, each group of pulses contains 4 MHz carrier signals, and a time interval Titv between each group of pulses should be more than 2 us. At time T2, enable signal EN provided by translation module 433 becomes logic high to turn ON switches S1 and S2. Then translation module 431 enters sleep mode, and watchdog timer 434 is used to monitor status of RX pin every 1 second. At time T3, command signal CMD becomes logic low, watchdog timer 434 is refreshed and translation module 431 is configured to provide differential signal VTX having 2 groups of pulses within predetermined time period Tsend which represents command "OFF". At time T4, enable signal EN provided by translation module 433 becomes logic low to turn OFF switches S1 and S2.

Figure 7:
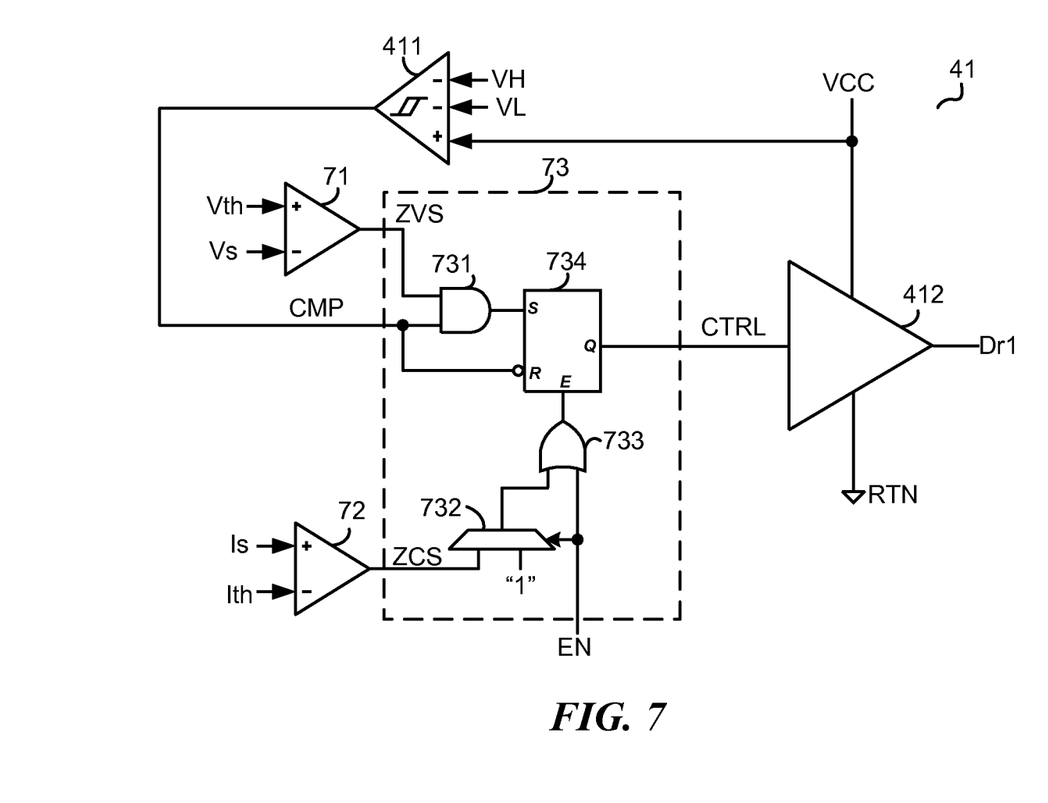
FIG. 7 schematically illustrates driving circuit 41 according to an embodiment of the present invention.

FIG. 7 schematically illustrates driving circuit 41 according to an embodiment of the present invention. As shown in FIG. 7, driving circuit 41 comprises comparison circuit 411, driver 412, a comparison circuit 71, a comparison circuit 72 and a logic circuit 73. Comparison circuit 411 is configured to provide comparison signal CMP based on voltage signal VCC, high threshold VH and low threshold VL. As shown in FIG. 7, when voltage signal VCC is larger than high threshold VH, comparison signal CMP becomes logic high, and when voltage signal VCC is less than low threshold VL, comparison signal CMP becomes logic low. Comparison circuit 71 has a non-inverting terminal configured to receive zero voltage threshold Vth, an inverting terminal configured to receive voltage sense signal Vs, and an output terminal configured to provide zero-voltage switching signal ZVS. Comparison circuit 72 has a non-inverting terminal configured to receive current sense signal Is, an inverting terminal configured to receive zero current threshold Ith, and an output terminal configured to provide zero-current switching signal ZCS. Logic circuit 73 is configured to receive comparison signal CMP, enable signal EN, zero-voltage switching signal ZVS and zero-current switching signal ZCS, and is configured to provide a control signal CTRL based on comparison signal CMP, enable signal EN, zero-voltage switching signal ZVS and zero-current switching signal ZCS. When enable signal EN is logic high, logic circuit 73 is configured to turn ON switch S1 and switch S2 based on comparison signal CMP and zero-voltage switching signal ZVS, and turn OFF switch S1 and switch S2 based on comparison signal CMP. When enable signal EN is logic low, logic circuit 73 is configured to turn OFF switch S1 and switch S2 based on zero-current switching signal ZCS. In one embodiment, logic circuit 73 comprises a gate circuit 731, a selective circuit 732, a gate circuit 733 and a RS flip-flop 734. Gate circuit 731 has a first input terminal coupled to the output terminal of comparison circuit 71 to receive zero-voltage switching signal ZVS, a second input terminal coupled to the output terminal of comparison circuit 411 to receive comparison signal CMP, and an output terminal. In one embodiment, gate circuit 731 is an AND gate. Selective circuit 732 has a first input terminal coupled to the output terminal of comparison circuit 72 to receive zero-current switching signal ZCS, a second input terminal coupled to a logic high signal, a control terminal configured to receive enable signal EN, and an output terminal. Gate circuit 733 has a first input terminal coupled to the output terminal of selective circuit 732, a second input terminal configured to receive enable signal EN, and an output terminal. In one embodiment, gate circuit 733 is an OR gate. RS flip-flop 734 has a set terminal S coupled to the output terminal of gate circuit 731, a reset terminal R reversed coupled to the output terminal of comparison circuit 411, an enable terminal E coupled to the output terminal of gate circuit 733, and an output terminal Q configured to provide control signal CTRL. Driver 412 has an input terminal coupled to logic circuit 73 to receive control signal CTRL, a power supply input terminal coupled to Pin VCC to receive voltage signal VCC, a ground reference terminal coupled to Pin RTN, and an output terminal configured to provide driving signal Dr1. As shown in FIG. 7, if enable signal EN is logic low, switch S1 and switch S2 are turned OFF by driver 412 when current sense signal Is is less than zero current threshold Ith. If enable signal EN is logic high, when voltage signal VCC is larger than high threshold VH and voltage sense signal Vs is less than zero voltage threshold Vth, RS flip-flop 734 is set to turn ON switch S1 and switch S2 through driver 412; and when voltage signal VCC is less than low threshold VL, RS flip-flop 734 is reset to turn OFF switch S1 and switch S2 through driver 412.

Figure 8:
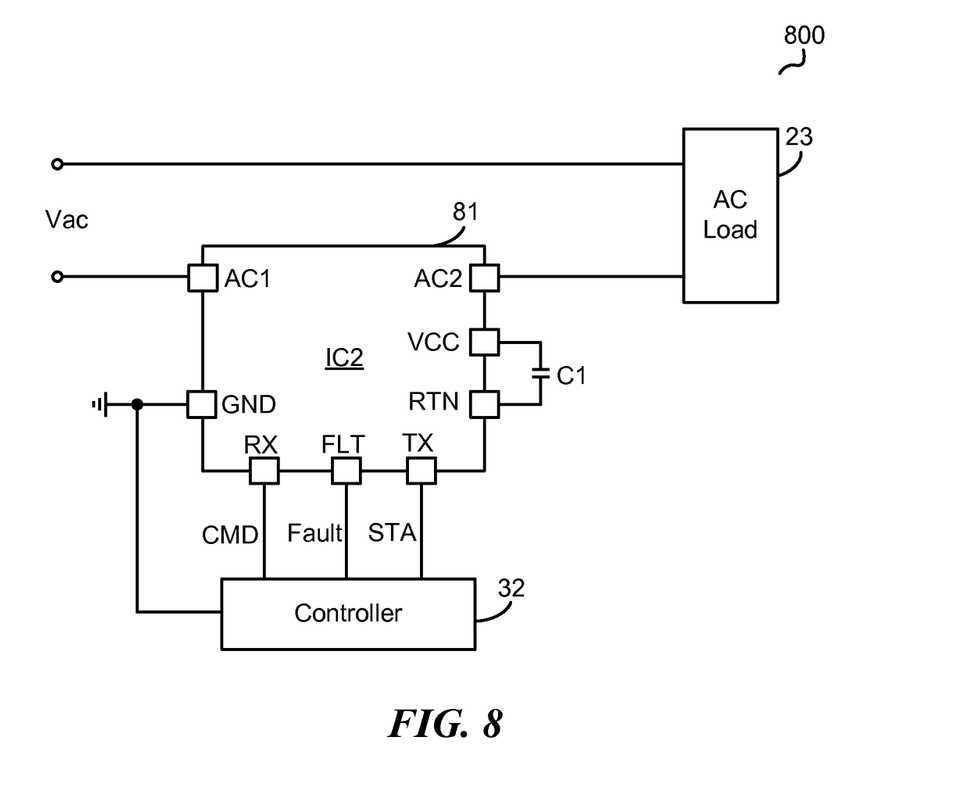
FIG. 8 schematically illustrates an AC switch control system 800 according to an embodiment of the present invention.

FIG. 8 schematically illustrates an AC switch control system 800 according to an embodiment of the present invention. AC switch control system 800 comprises two input ports to receive AC input signal Vac, AC load 23, and an AC switch circuit 81 coupled between AC input signal Vac and AC load 23. In one embodiment, AC switch circuit 81 is integrated on a chip IC2. Chip IC2 comprises Pins AC1, AC2, VCC, RTN, RX, TX, FLT and GND. Symbols "AC1", "AC2" may represent Pins of chip 102 or input terminals of AC switch circuit 81, symbol "VCC" may represent one Pin of chip IC2 or voltage signal VCC, symbol "RTN" may represent one Pin of chip IC2 or neutral node RTN, and symbol "GND" may represent one Pin of chip IC2 or a reference ground GND. Pin AC1 is coupled to one input port of AC switch control system 800 to receive AC input signal Vac, and Pin AC2 is coupled to one input terminal of AC load 23, the other input port of AC switch control system 800 is coupled to the other input terminal of AC load 23. Capacitor C1 is coupled between Pin VCC and Pin RTN. Controller 32 is employed to control ON/OFF of AC switch circuit 81 by sending command signal CMD to Pin RX of chip IC2, AC switch circuit 81 sends back fault indicating signal Fault to controller 32 through Pin FLT, and sends back a status signal STA to controller 32 through Pin TX.

Figure 9:
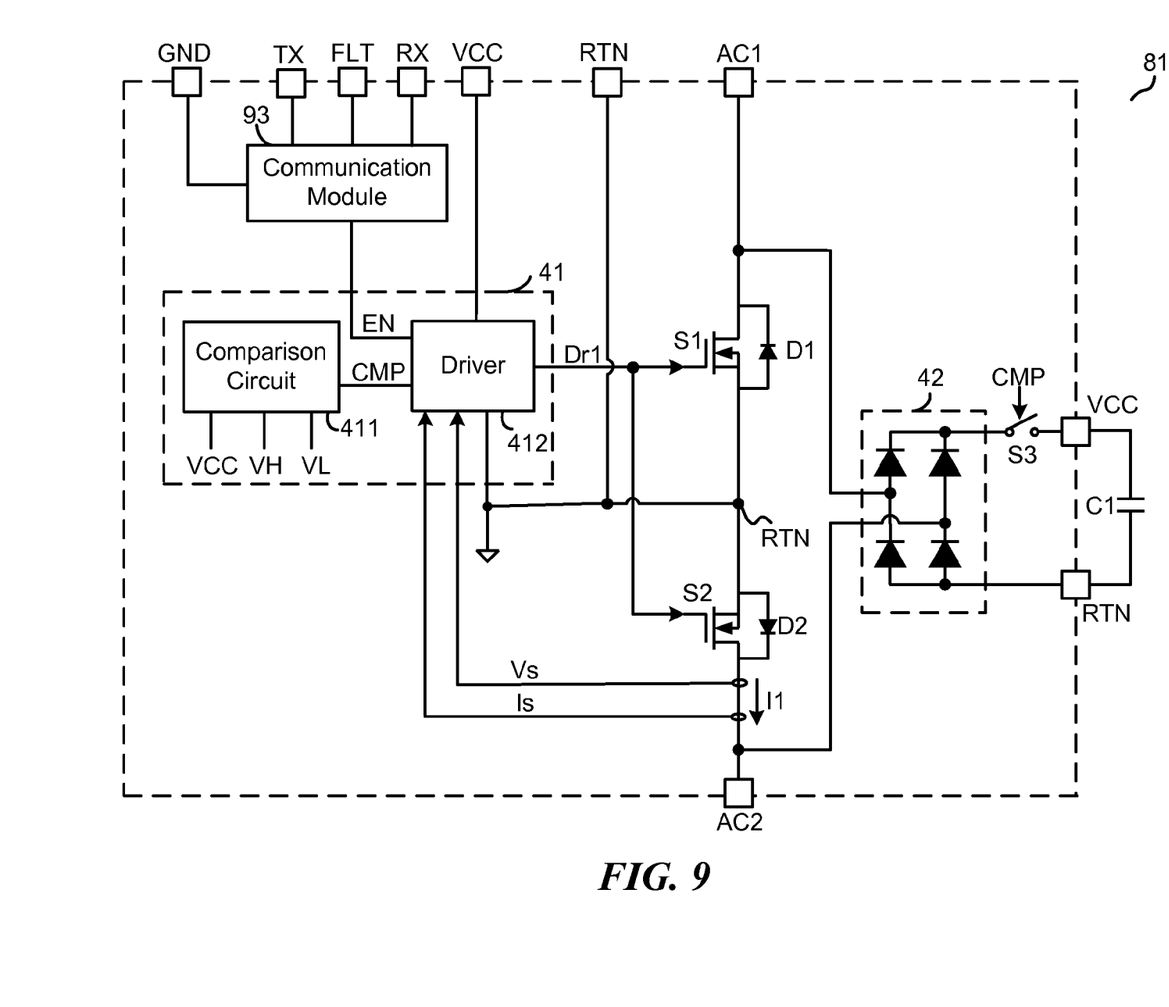
FIG. 9 schematically illustrates an AC switch circuit 81 according to an embodiment of the present invention.

FIG. 9 schematically illustrates AC switch circuit 81 according to an embodiment of the present invention. AC switch circuit 81 shown in FIG. 9 is similar to AC switch circuit 31, and only differences between AC switch circuit 81 and AC switch circuit 31 are described hereinafter for simplification. A communication module 93 has a first input terminal coupled to Pin RX to receive command signal CMD, a first output terminal configured to provide enable signal EN based on command signal CMD, a second output terminal coupled to Pin FLT to provide fault indicating signal Fault, a third output terminal coupled to Pin TX to send status signal STA representing status of AC switch circuit 81, and a ground reference terminal coupled to pin GND. Fault indicating signal Fault is configured to indicate if any fault condition happens on AC switch circuit 81. In one embodiment, when fault happens on AC switch circuit 81, then fault indicating signal Fault becomes logic low, otherwise fault indicating signal Fault is logic high. One embodiment of detailed circuit of communication module 93 is shown in FIG. 10.

Figure 10:
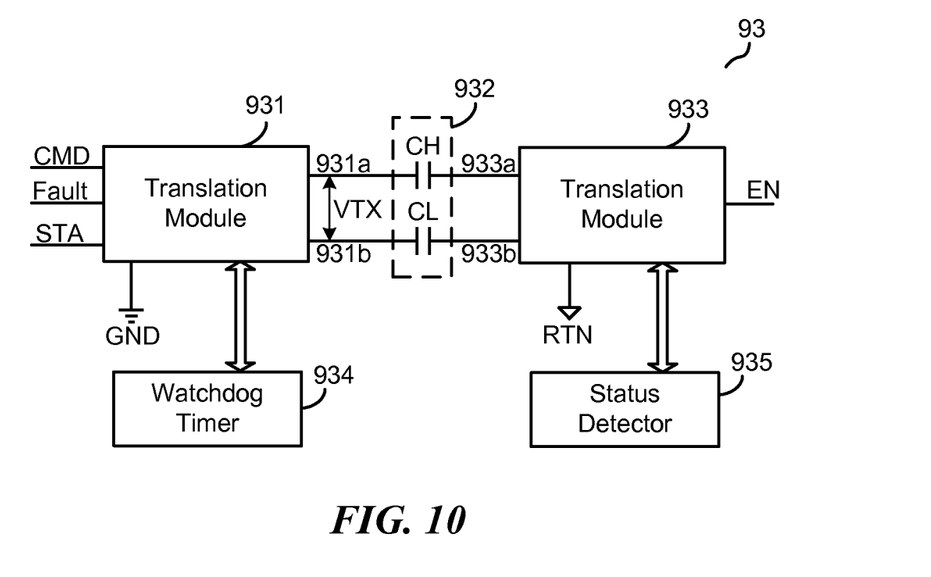
FIG. 10 schematically illustrates a communication module 93 according to an embodiment of the present invention.

FIG. 10 schematically illustrates communication module 93 according to an embodiment of the present invention. Communication module 93 comprises a translation module 931, an isolation module 932, and a translation module 933. Translation module 931 comprises an input terminal configured to receive command signal CMD, a first output terminal configured to provide fault indicating signal Fault, a second output terminal configured to provide status signal STA, a data terminal 931a and a data terminal 931b. When command signal CMD represents command "ON", or command "OFF", translation module 931 is configured to provide corresponding differential signal VTX across data terminal 931a and data terminal 931b. When command signal CMD represents command "Read", translation module 931 is configured receive corresponding differential signal VTX across data terminal 931a and data terminal 931b. Isolation module 932 is coupled between translation module 931 and translation module 933, and translation module 931 is isolated with driving circuit 41, switch S1, and switch S2. In one embodiment, isolation module 932 comprises isolated capacitors CH and CL. One terminal of isolated capacitor CH is coupled to data terminal 931a of translation module 931, and the other terminal of isolated capacitor CH is coupled to a data terminal 933a of translation module 933. One terminal of isolated capacitor CL is coupled to data terminal 931b of translation module 931, and the other terminal of isolated capacitor CL is coupled to a data terminal 933b of translation module 933. Translation module 933 further comprises an output terminal configured to provide enable signal EN based on differential signal VTX. A status detector 935 is configured to send status information of AC switch circuit 81 to translation module 933. Status information of AC switch circuit 81 may comprises SW abnormal, over current, over temperature, and so on. In one embodiment, when any fault condition happened on AC switch circuit 81 is detected by status detector 935, translation module 933 is configured to inform translation module 931 through isolation module 932, and translation module 931 is configured to inform controller 32 that fault has happened on AC switch circuit 81 by sending fault indicating signal Fault, e.g., with logic low.

In one embodiment, when receives command signal CMD, translation module 931 is configured to translate command signal CMD and send differential signal VTX with high frequency carrier signals. Differential signal VTX may consist of groups of pulses, wherein each group of pulses contains high frequency carrier signals, for example 4 MHz carrier signals. In one embodiment, different number N of groups of pulses of differential signal VTX within predetermined time period Tsend represents different commands. Table 2 shows one example of commands definition.

TABLE 2

| | commands definition | |
|---|---|---|
| N | Command | Description |
| 2 | OFF | Turn OFF AC switch circuit 81 |
| 4 | ON | Turn ON AC switch circuit 81 |
| 6 | Read | Read status of AC switch circuit 81 |

Translation module 933 is configured to translate differential signal VTX and response to different commands correspondingly. When receives differential signal VTX representing command "ON", translation module 933 sends enable signal EN to turn ON switch S1 and switch S2. After that translation module 933 may send back status information of AC switch circuit 81 to translation module 931 through isolation module 932, and translation module 931 is configured to provide fault indicating signal Fault correspondingly. When receives differential signal VTX representing command "OFF", translation module 933 sends enable signal EN to turn OFF switch S1 and switch S2. After that translation module 933 may send back status information of AC switch circuit 81 to translation module 931 through isolation module 932, and translation module 931 is configured to provide fault indicating signal Fault correspondingly. When receives differential signal VTX representing command "Read", translation module 933 sends back status information of AC switch circuit 81. One example of status definition is shown in Table 3.

TABLE 3

| | Status definition | |
|---|---|---|
| N | Status | Description |
| 2 | OFF | AC switch circuit 81 is OFF |
| 4 | ON | AC switch circuit 81 is ON |
| 6 | FAULT | SW abnormal |
| 8 | OC | Over current |

In one embodiment, communication module 43 further comprises a watchdog timer 934. Watchdog timer 934 is configured to monitor status of command signal CMD every monitoring time period, e.g., 1 s. And watchdog timer 934 is refreshed when command signal CMD represents command "ON". In one embodiment, translation module 931 is configured to turn OFF switch S1 and switch S2 when time of watchdog timer 934 is longer than a threshold time period.

Figure 11:
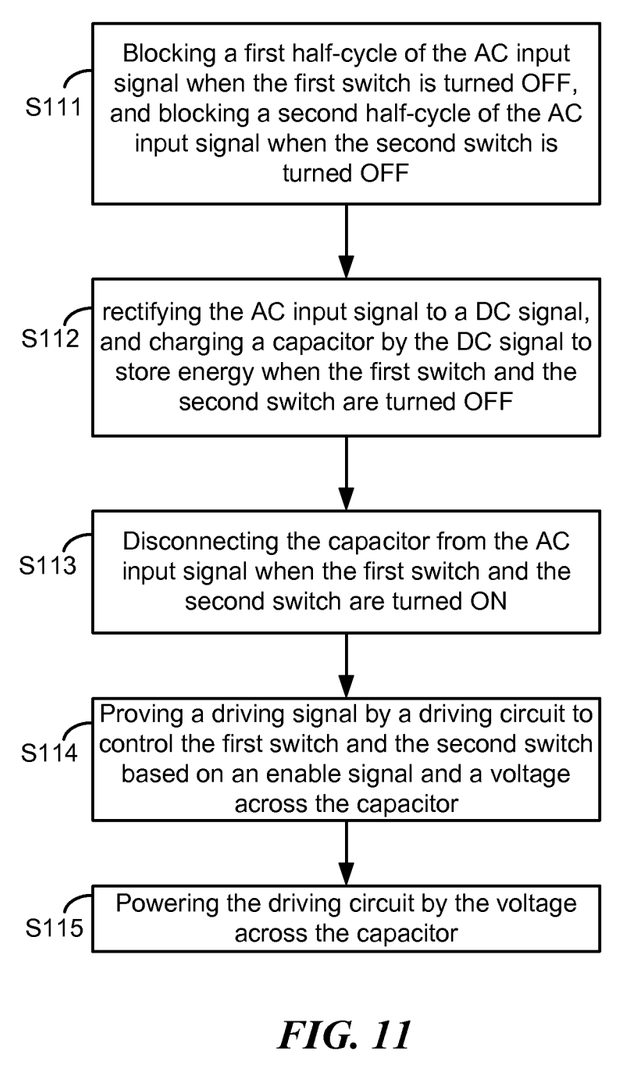
FIG. 11 shows a flow chart illustrating a control method for an AC switch circuit according to an embodiment of the present invention.

FIG. 11 shows a flow chart illustrating a control method for an AC switch circuit coupled between an AC input signal and an AC load, the AC switch circuit comprises a first switch and a second switch coupled in series. The control method comprises steps S111-S115.

At step S111, blocking a first half-cycle of the AC input signal by the first switch when the first switch is turned OFF, and blocking a second half-cycle of the AC input signal by the second switch when the second switch is turned OFF. At step S112, rectifying the AC input signal to a DC signal and charging a capacitor by the DC signal to store energy when the first switch and the second switch are turned OFF.

At step S113, disconnecting the capacitor from the AC input signal when the first switch and the second switch are turned ON.

At step S114, providing a driving signal by a driving circuit to control the first switch and the second switch based on an enable signal and a voltage across the capacitor. In one embodiment, when the enable signal is at a first state, e.g., logic high, the first switch and the second switch are turned ON based on the voltage across the capacitor; and when the enable signal is at a second state, e.g., logic low, the first switch and the second switch are turned OFF. In one embodiment, a common node of the first switch and the second switch is coupled to a ground reference terminal of the driving circuit.

At step S115, powering the driving circuit by the voltage across the capacitor. The capacitor is coupled between a power supply terminal of the driving circuit and the ground reference terminal of the driving circuit.

In one embodiment, when the voltage across the capacitor is less than a low threshold, the first switch and the second switch are turned OFF, and the capacitor is charged by the AC input signal. When the voltage across the capacitor is higher than a high threshold, the first switch and the second switch are turned ON, and the capacitor is disconnected from the AC input signal.

In one embodiment, the control method further comprises that when a current flowing through the first switch and the second switch is less than a current threshold, the driving circuit is allowed to turn OFF the first switch and the second switch to achieve zero current switch OFF.

In one embodiment, the control method further comprises that when a voltage across the first switch or the second switch is less than a voltage threshold, the driving circuit is allowed to turn ON the first switch and the second switch to achieve zero voltage switch ON.

Note that in the flow chart described above, the box functions may also be implemented with different order as shown in FIG. 11. For example, two successive box functions may be executed meanwhile, or sometimes the box functions may be executed in reverse order.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. An alternating current (AC) switch circuit coupled between an AC input signal and an AC load, the AC switch circuit comprising:
   a first terminal, coupled to the AC input signal;
   a second terminal, coupled to the AC load;
   a first switch, coupled to block a first half-cycle of the AC input signal when turned OFF, wherein the first switch comprises a first terminal coupled to the first terminal of the AC switch circuit, a second terminal, and a control terminal;
   a second switch, coupled in series with the first switch to block a second half-cycle of the AC input signal when turned OFF, wherein the second switch comprises a first terminal coupled to the second terminal of the first switch, a second terminal coupled to the second terminal of the AC switch circuit, and a control terminal;
   a communication module, having an input terminal and a first output terminal, wherein the input terminal is configured to receive a command signal, and the first output terminal is configured to provide an enable signal based on the command signal, wherein the enable signal is isolated with the command signal;
   a driving circuit, having an input terminal, an output terminal, a power supply terminal and a ground reference terminal, wherein the power supply terminal is configured to receive a voltage signal, the ground reference terminal is coupled to the second terminal of the first switch and the first terminal of the second switch, the input terminal is configured to receive the enable signal, and the output terminal is coupled to the control terminal of the first switch and the control terminal of the second switch to provide a driving signal based on the enable signal and the voltage signal, wherein when the enable signal is at a first state, the driving signal is configured to turn ON and turn OFF the first switch and the second switch based on the voltage signal, and when the enable signal is at a second state, the driving signal is configured to turn OFF the first switch and the second switch; and
   a power generation circuit, having a first input terminal, a second input terminal, a first output terminal and a second output terminal, wherein the first input terminal is coupled to the first terminal of the AC switch circuit, the second input terminal is coupled to the second terminal of the AC switch circuit, the first output terminal is coupled to the power supply terminal of the driving circuit, and the second output terminal is coupled to the ground reference terminal of the driving circuit, and wherein the power generation circuit is charged by the AC input signal to store energy when the first switch and the second switch are turned OFF, and the power generation circuit is disconnected from the AC input signal when the first switch and the second switch are turned ON.

2. The AC switch circuit of claim 1, wherein when the enable signal is at the first state, the first switch and the second switch are turned OFF if the voltage signal is less than a low threshold, and the first switch and the second switch are turned ON again if the voltage signal is larger than a high threshold, wherein the high threshold is larger than the low threshold.

3. The AC switch circuit of claim 1, wherein the driving circuit further comprises:
 a comparison circuit, configured to provide a comparison signal based on the voltage signal, a high threshold and a low threshold; and
 a driver, configured to provide the driving signal based on the comparison signal and the enable signal, wherein the driver is powered by the voltage signal, and wherein when the enable signal is at the first state, the driver is configured to provide the driving signal to turn OFF the first switch and the second switch if the voltage signal is less than the low threshold, and the driver is configured to provide the driving signal to turn ON the first switch and the second switch again if the voltage signal is larger than the high threshold.

4. The AC switch circuit of claim 1, wherein the power generation circuit further comprises:
 a rectifier circuit, having a first input terminal, a second input terminal, a first output terminal and a second output terminal, wherein the first input terminal is coupled to the first terminal of the AC switch circuit, the second input terminal is coupled to the second terminal of the AC switch circuit, the first output terminal is coupled to the power supply terminal of the driving circuit, and the second output terminal is coupled to the ground reference terminal of the driving circuit; and
 a first capacitor, coupled between the first output terminal of the rectifier circuit and the second output terminal of the rectifier circuit, wherein the first capacitor is charged to store energy when the first switch and the second switch are turned OFF.

5. The AC switch circuit of claim 1, wherein the driving circuit is configured to receive a current sense signal indicative of a current flowing through the first switch and the second switch, and the driving circuit is allowed to turn OFF the first switch and the second switch when the current sense signal is less than a zero current threshold.

6. An AC switch circuit, coupled between an AC input signal and an AC load, the AC switch circuit comprising:
 a first terminal, coupled to the AC input signal;
 a second terminal, coupled to the AC load;
 a first switch, coupled to block a first half-cycle of the AC input signal when turned OFF;
 a second switch, coupled in series with the first switch to block a second half-cycle of the AC input signal when turned OFF;
 a driving circuit, configured to provide a driving signal to control the first switch and the second switch based on an enable signal, wherein the driving circuit further comprises a power supply terminal, and a ground reference terminal coupled to a common node of the first switch and the second switch; and
 a power generation circuit, configured to provide a voltage signal across the power supply terminal of the driving circuit and the ground reference terminal of the driving circuit, wherein the power generation circuit is configured to store energy from the AC input signal when the first switch and the second switch are turned OFF.

7. The AC switch circuit of claim 6, wherein the power generation circuit further comprises:
 a rectifier circuit, having a first input terminal, a second input terminal, a first output terminal and a second output terminal, wherein the first input terminal is coupled to the first terminal of the AC switch circuit, the second input terminal is coupled to the second terminal of the AC switch circuit, the first output terminal is coupled to the power supply terminal of the driving circuit, and the second output terminal is coupled to the ground reference terminal of the driving circuit; and
 a first capacitor, coupled between the first output terminal of the rectifier circuit and the second output terminal of the rectifier circuit, wherein the first capacitor is charged to store energy when the first switch and the second switch are turned OFF, and the first capacitor is disconnected from the AC input signal when the first switch and the second switch are turned OFF.

8. The AC switch circuit of claim 6, wherein:
 the first switch further comprises a first diode, wherein the first diode comprises a cathode coupled to the first terminal of the AC switch circuit and an anode coupled to a common node of the first switch and the second switch; and
 the second switch further comprises a second diode, wherein the second diode comprises a cathode coupled to the second terminal of the AC switch circuit and an anode coupled to the common node of the first switch and the second switch.

9. The AC switch circuit of claim 6, wherein the driving circuit further comprises:
 a comparison circuit, configured to provide a comparison signal based on the voltage signal, a high threshold and a low threshold; and
 a driver, configured to provide a driving signal based on the comparison signal and the enable signal; wherein
 when the enable signal is at a first state, the driving signal is configured to turn OFF the first switch and the second switch if the voltage signal is less than the low threshold, and the driving signal is configured to turn ON the first switch and the second switch again if the voltage signal is larger than the high threshold; and wherein
 when the enable signal is at a second state, the driving signal is configured to turn OFF the first switch and the second switch.

10. The AC switch circuit of claim 6, further comprising a communication module, wherein the communication module is configured to provide the enable signal based on a command signal, and wherein the enable signal is isolated from the command signal by isolation capacitors.

* * * * *